(12) United States Patent
Burns et al.

(10) Patent No.: US 10,008,093 B2
(45) Date of Patent: Jun. 26, 2018

(54) SYSTEMS, METHODS AND APPARATUS FOR DETERMINING BUTTON DEGRADATION OF A USER INPUT DEVICE

(71) Applicant: DISH Technologies L.L.C., Englewood, CO (US)

(72) Inventors: Christopher Burns, Centennial, CO (US); Brad Bylund, Littleton, CO (US); Harold Jaramillo, Castle Pines, CO (US); Paul Langer, Westminster, CO (US); Jeremy Mickelsen, Denver, CO (US)

(73) Assignee: DISH TECHNOLOGIES L.L.C., Englewood, CO (US)

( * ) Notice: Subject to any disclaimer, the term of this patent is extended or adjusted under 35 U.S.C. 154(b) by 0 days. days.

(21) Appl. No.: 15/148,075

(22) Filed: May 6, 2016

(65) Prior Publication Data

US 2017/0323552 A1    Nov. 9, 2017

(51) Int. Cl.
| | |
|---|---|
| *G08B 21/00* | (2006.01) |
| *G08B 21/18* | (2006.01) |
| *H04N 5/44* | (2011.01) |
| *H04N 5/445* | (2011.01) |
| *G01R 31/327* | (2006.01) |
| *G01R 31/00* | (2006.01) |

(52) U.S. Cl.
CPC .......... *G08B 21/185* (2013.01); *G01R 31/00* (2013.01); *G01R 31/3274* (2013.01); *H04N 5/4403* (2013.01); *H04N 5/445* (2013.01)

(58) Field of Classification Search
None
See application file for complete search history.

(56) References Cited

U.S. PATENT DOCUMENTS

| 2008/0116906 A1 | 5/2008 | Martin et al. |
| 2010/0245830 A1* | 9/2010 | Ito ........................ H01S 3/0014 |
| | | 356/447 |

(Continued)

FOREIGN PATENT DOCUMENTS

| CN | 104459530 A | 8/2015 |
| EP | 2012431 A1 | 1/2009 |
| KR | 20160040886 A | 4/2016 |

OTHER PUBLICATIONS

PCT Application No. PCT/US2017/029257, International Search Report and Written Opinion, dated Aug. 2, 2017, 12 pages.

*Primary Examiner* — George Bugg
*Assistant Examiner* — Renee Dorsey
(74) *Attorney, Agent, or Firm* — Perkins Coie LLP

(57) ABSTRACT

Various embodiments of systems, apparatus, and methods are described for A user input device, such as a remote control device. In one implementation, the remote control device includes at least one pair of electrical contacts, at least one button configured to electrically connect the at least one pair of electrical contacts, and a degradation measurement module in electrical communication with at least one of the electrical contacts. The degradation measurement module is configured to determine a degradation level of the at least one button based on at least one electrical property of a circuit associated with the at least one button when the at least button electrically connects the at least one pair of electrical contacts.

20 Claims, 6 Drawing Sheets

(56) References Cited

U.S. PATENT DOCUMENTS

| | | | |
|---|---|---|---|
| 2011/0031985 A1* | 2/2011 | Johnson | G06F 21/86 324/681 |
| 2012/0230073 A1* | 9/2012 | Newman, Jr. | H05B 33/0815 363/126 |
| 2013/0021155 A1* | 1/2013 | Gandara | G08B 29/06 340/540 |
| 2014/0225630 A1* | 8/2014 | Stethem | F41H 13/0018 324/691 |
| 2016/0100248 A1* | 4/2016 | Mehrabi | H04R 3/00 381/384 |
| 2016/0169945 A1* | 6/2016 | Mauder | G01R 31/3274 324/126 |

* cited by examiner

SYSTEMS, METHODS AND APPARATUS FOR DETERMINING BUTTON DEGRADATION OF A USER INPUT DEVICE

TECHNICAL FIELD

The present invention relates generally to user input devices, and more particularly to buttons of the user input devices and their degradation over time.

BACKGROUND

Many electronic devices—especially consumer electronic devices—include the ability to be remotely controlled by a user. The user enters commands on a user input device, which then transmits the commands to the electronic device. Typically the commands are transmitted to the electronic device wirelessly using infrared or radio frequency signals. Occasionally the electronic device may fail to carry out the user's command. This failure may be due to a variety of factors, such as low battery in the user input device, blocked line-of-sight between the user input device and the electronic device, entry of an incorrect command on the user input device, or a hardware failure of the user input device and/or electronic device. In many cases, the user may be unaware of which of these factors caused the failure of the electronic device to carry out the user's command.

BRIEF DESCRIPTION OF THE DRAWINGS

The same number represents the same element or same type of element in all drawings.

DETAILED DESCRIPTION OF THE DRAWINGS

Figure 1:
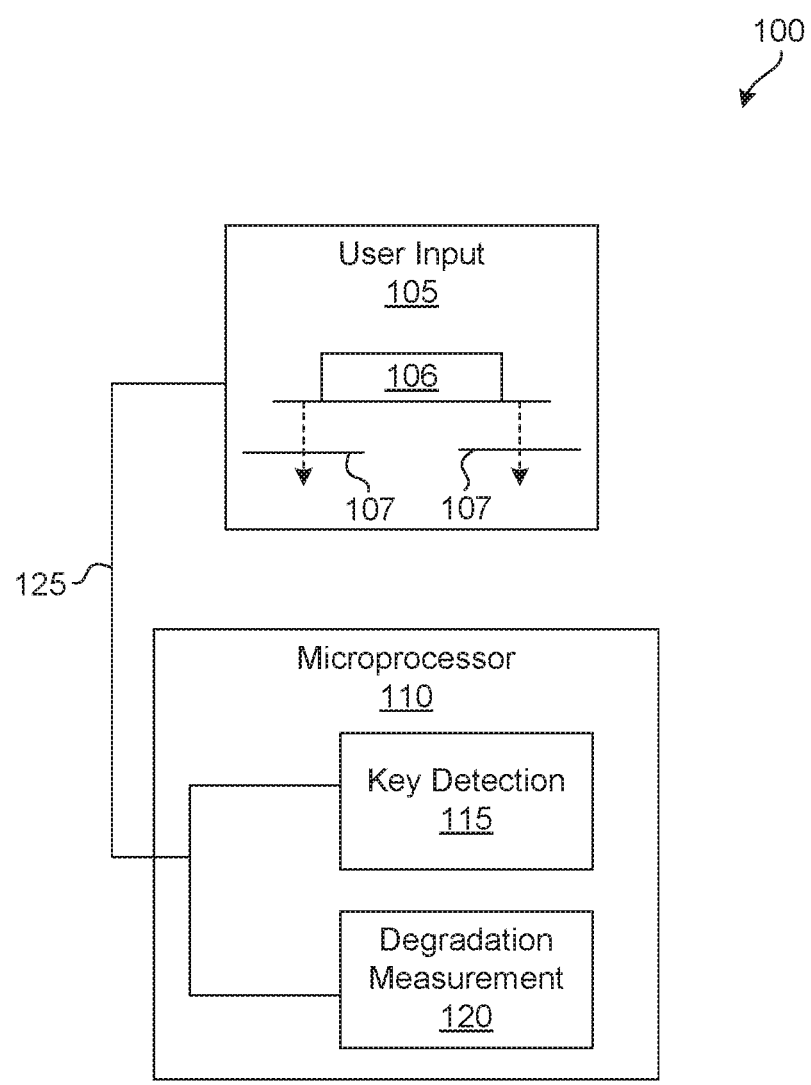
FIG. 1 is a block diagram of a user input device 100, according to one non-limiting illustrated embodiment.

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with receiving, processing, and outputting signals have not been shown or described in detail to avoid unnecessarily obscuring descriptions of the embodiments.

Unless the context requires otherwise, throughout the specification and claims which follow, the word "comprise" and variations thereof, such as "comprises" and "comprising," are to be construed in an open, inclusive sense that is as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment.

The use of ordinals such as first, second and third does not necessarily imply a ranked sense of order, but rather may only distinguish between multiple instances of an act or structure.

The headings and Abstract of the Disclosure provided herein are for convenience only and do not interpret the scope or meaning of the embodiments.

The term "signal" may be any digital or analog signal. Those signals may include, but are not limited to, a bit, a specified set of bits, an AC signal, or a DC signal. Uses of the term "signal" in the description may include any of these different interpretations. It will also be understood to one skilled in the art that the term "connected" is not limited to a physical connection but can refer to any means of communicatively or operatively coupling two devices.

The disclosure uses the terms "television converter," "receiver," "set-top box," "receiving device," "television receiver," "television recording device," "set-top box (STB)", "satellite set-top box," "satellite receiver," "cable set-top box," "cable receiver," and "television tuner" to refer interchangeably to a converter device or electronic equipment that has the capacity to acquire, process and distribute one or more signals transmitted by broadcast, cable, telephone, or satellite distributors. DVR and "personal video recorder (PVR)" refer interchangeably to devices that can record and play back signals and that may implement trick functions including, but not limited to, fast-forward, rewind and pause. DVR and PVR functionality or devices may be combined with a television converter. The signals transmitted by these broadcast, cable, telephone or satellite distributors may include, individually or in any combination, internet, radio, television or telephonic data or information. One skilled in the art will recognize that a television converter device may be implemented as an external self-enclosed unit, a plurality of external self-enclosed units or as an internal unit housed within a television. One skilled in the art will recognize that the present invention can apply to analog and digital satellite set-top boxes.

FIG. 1 is a block diagram of a user input device 100, according to one non-limiting illustrated embodiment. In some examples, the user input device 100 may be a remote control device for inputting user commands for a receiving device.

The user input device 100 includes a user input section 105 having a one or more buttons 106. While only one exemplary button 106 is shown in FIG. 1, it should be understood that the user input section 105 may include many buttons 106 which operate in a similar manner. The buttons 106 may be located such that a user can view and interact with the buttons 106. Each of the buttons 106 is associated with a pair of electrical contacts 107. When a button 106 is depressed, the depressed button 106 forms an electrical connection between the pair of electrical contacts 107, and a signal 125 is transmitted from the user input section 105. A microprocessor 110 receives the signal 125 and a key detection module 115 detects which button 106 was depressed based on the signal 125. The key detection module 115 may use various techniques to determine which button of the one or more buttons 106 is depressed, as further described herein.

Over time, one or more of the buttons 106 may become degraded. This may decrease the ability of a button 106 to form an electrical connection between the contacts 107. For example, the impedance of a button 106 may increase as it is used over time. This increase in impedance may be caused by various factors, such as the wearing down of the conductor (often made of carbon) in the button 106 that connects the pair of electrical contacts 107, or on the electrical contacts 107. The overall impedance may also be increased as a result of various substances in the user input device 100, such as solder flux, plastic/rubber components, and/or contamination from the user spilling liquids on the user input device 100. Inaccurate mechanical alignment of the button 106 and electrical contacts 107 may also cause an increase in the impedance.

In order to detect the degradation of a button 106, or the entire input section 107, the user input device 100 includes a degradation measurement module 120. The degradation measurement module 120 may be a component of the microprocessor 110 or an independent component of the user input device 100. The degradation measurement module 120 receives the signal 125 from the user input section 105 when a button 106 is depressed. In some embodiments, the microprocessor 110 may include a multiplexer or switch to route the signal 125 to the degradation measurement module 120. The degradation measurement module 120 determines at least one electrical property of the circuit which transmitted the signal 125. Because the depressed button 106 and electrical contacts 107 form part of the circuit, the degradation level of the depressed button 106 and/or electrical contacts 107 may be determined from one or more properties of the circuit.

For example, in some embodiments, the degradation measurement module 120 determines a voltage level of the signal 125. In other embodiments, the degradation measurement module 120 determines a current level of the signal 125. This voltage or current level may be compared to historical levels to determine how the electrical properties of the depressed button 106 change over time. In some embodiments, an approximate impedance associated with the depressed button 106 may be derived from the measured voltage and/or current levels. This impedance may then be compared to historical impedances to determine a degradation level of the depressed button 106. If the degradation level exceeds a threshold, then the user or manufacturer may be notified of the degradation level, as further described herein.

In some embodiments, the degradation measurement module 120 is an analog-to-digital converter. The analog-to-digital converter converts an analog voltage or current level into a numerical value representative of the voltage or current level. This numerical value may be stored and compared to historical values to determine the degradation level of the depressed button 106. In some embodiments, the historical values may include at least one value associated with a new user input device 100.

In some embodiments, the user input device 100 includes an indicator (not shown). The indicator may receive information from the degradation measurement module 120 and/or microprocessor 110 associated with the degradation level. If the degradation level exceeds a threshold, then the indicator may be instructed to indicate to a user that the depressed button 106 is degraded. The indication may include a light, a sound, a displayed message, tactile feedback, or other types of indication.

In some embodiments, the user input device 100 includes a communication module (not shown). The communication module may allow the user input device 100 to communicate with an external device (such as a receiving device shown in FIGS. 3 and 4). The user input device 100 may transmit information associated with the degradation levels of the buttons 106 to the external device. The external device may notify a user or manufacturer of the user input device if the degradation level for one or more of the buttons 106 exceeds a threshold. The external device may also compile historical information regarding the degradation level of the buttons 106.

Figure 2:
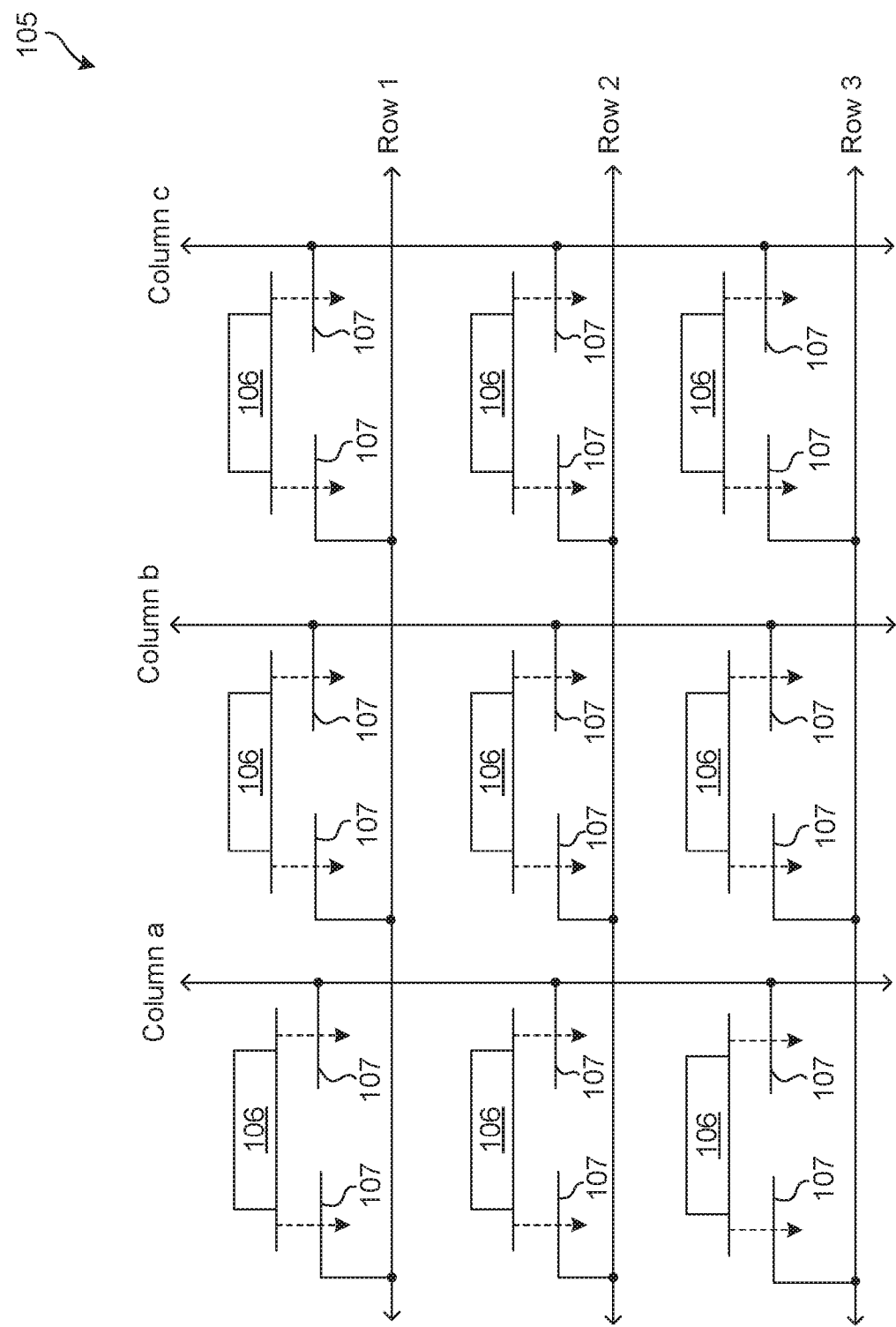
FIG. 2 is a block diagram of a user input section 105, according to one non-limiting illustrated embodiment.

FIG. 2 is a block diagram of a user input section 105, according to one non-limiting illustrated embodiment. The user input section includes buttons 106. While the diagram shows nine buttons 106, it should be understood that a user input section may include additional or fewer buttons. Each of the buttons 106 is associated with a pair of electrical contacts 107. When a button 106 is depressed, the depressed button 106 forms an electrical connection between the pair of electrical contacts 107. As a result, the depressed button forms an electrical connection between a column and a row. Based on which column and row are connected, the key detection module 115 shown in FIG. 1 may determine which button 106 was depressed.

The key detection module 115 may detect which column and row are connected using various techniques. For example, the key detection module 115 may send different signals over each column, and then detect which from which row a particular signal is received, or vice versa. Similarly, each column may be associated with different sensing circuits which allow determination of the row pressed, and in conjunction with information of the column drive state/function, a particular key may be determined, or vice versa. Other key detection techniques may also be used.

Each of the key detection techniques allow the degradation measurement module 120 (shown in FIG. 1) to determine an electrical property of the circuit formed by the depressed button 106 and electrical contacts 107. Based on the measured electrical property, the degradation measurement module 120 determines a degradation level of the depressed button 106 and/or electrical contacts 107, as described in reference to FIG. 1. In some embodiments, where it is not cost effective or convenient to have degradation measurement circuitry 120 connected to all buttons 106 in the user input section 105, the buttons 106 with higher expected use may be preferentially connected to the degradation measurement circuit 120. Preference of buttons 106 to connect may also be given to circuitry layout/routing or convenience of assembly.

Figure 3:
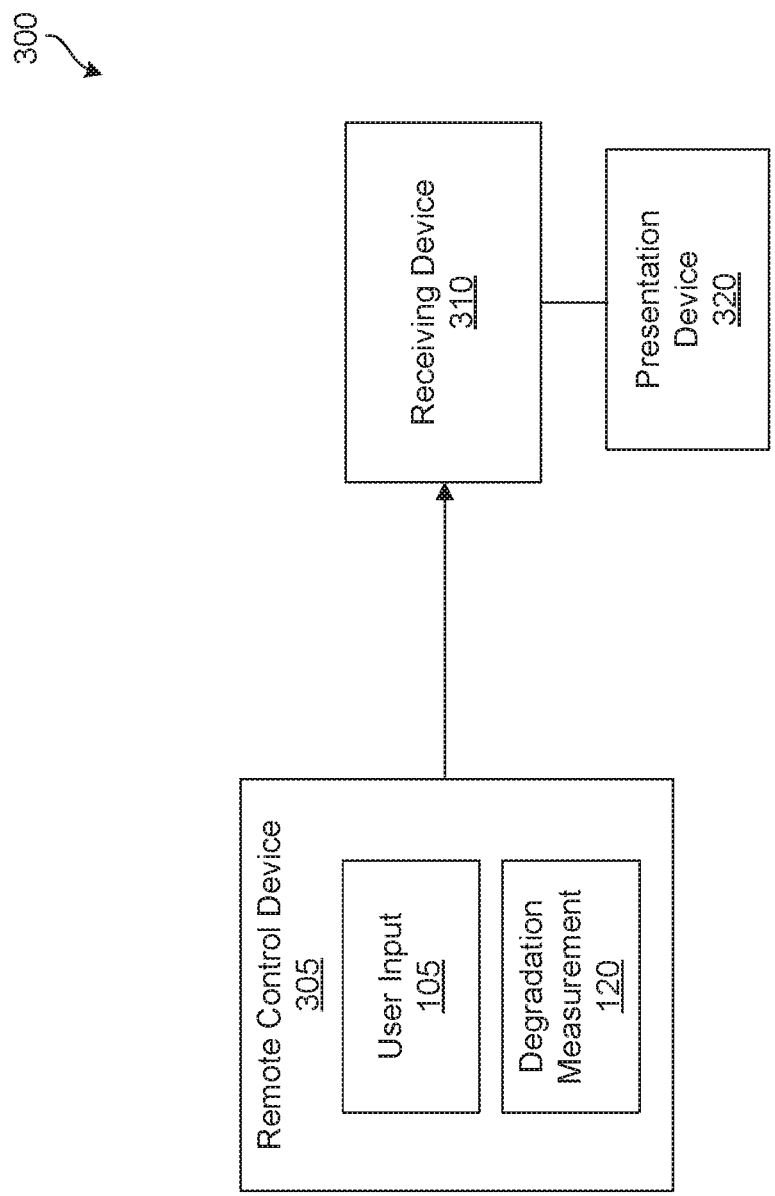
FIG. 3 is a block diagram of a communication system 300, according to one non-limiting illustrated embodiment.

FIG. 3 is a block diagram of a communication system 300, according to one non-limiting illustrated embodiment. The system includes a remote control device 305. The remote control device 305 may be an example of the user input device 100 described in reference to FIG. 1. The remote control device 305 includes a user input section 105 having one or more buttons, as described in reference to FIGS. 1 and 2. A degradation measurement module 120 determines a degradation level of the button in the user input section 105, as described in reference to FIGS. 1 and 2.

The remote control device 305 may communicate with a receiving device 310, such as a set-top box. The remote control device 305 may transmit commands to the receiving device 310 which control the operation of the receiving device 310. For example, the remote control device 305 may transmit a command for the receiving device to tune to a particular television channel.

The receiving device 310 may be connected to, or be a component of, a presentation device 320. The presentation device 320 displays content that the receiving device 310 receives.

In some embodiments, the remote control device 305 transmits degradation level information to the receiving device 310. Based on the degradation level information, the receiving device 310 may instruct the presentation device 320 to display a notification to the user regarding the degradation level of a button on the remote control device 305. The user may then take action to fix or replace the degraded button or the entire remote control device 305.

In some embodiments, the receiving device 310 may be in communication with a network or other external devices. The receiving device 310 may transmit the degradation level information over the network. A remote computer may receive the degradation level information. The remote computer may compile degradation level information from multiple remote control devices. Based on this compiled information, a manufacturer of the remote control device 305 may become aware of the lifespan or defects with the remote control device 305. In some embodiments, the remote computer may automatically send a replacement remote control device or other fix for the degraded button to the user in response to the degradation level information.

Figure 4:
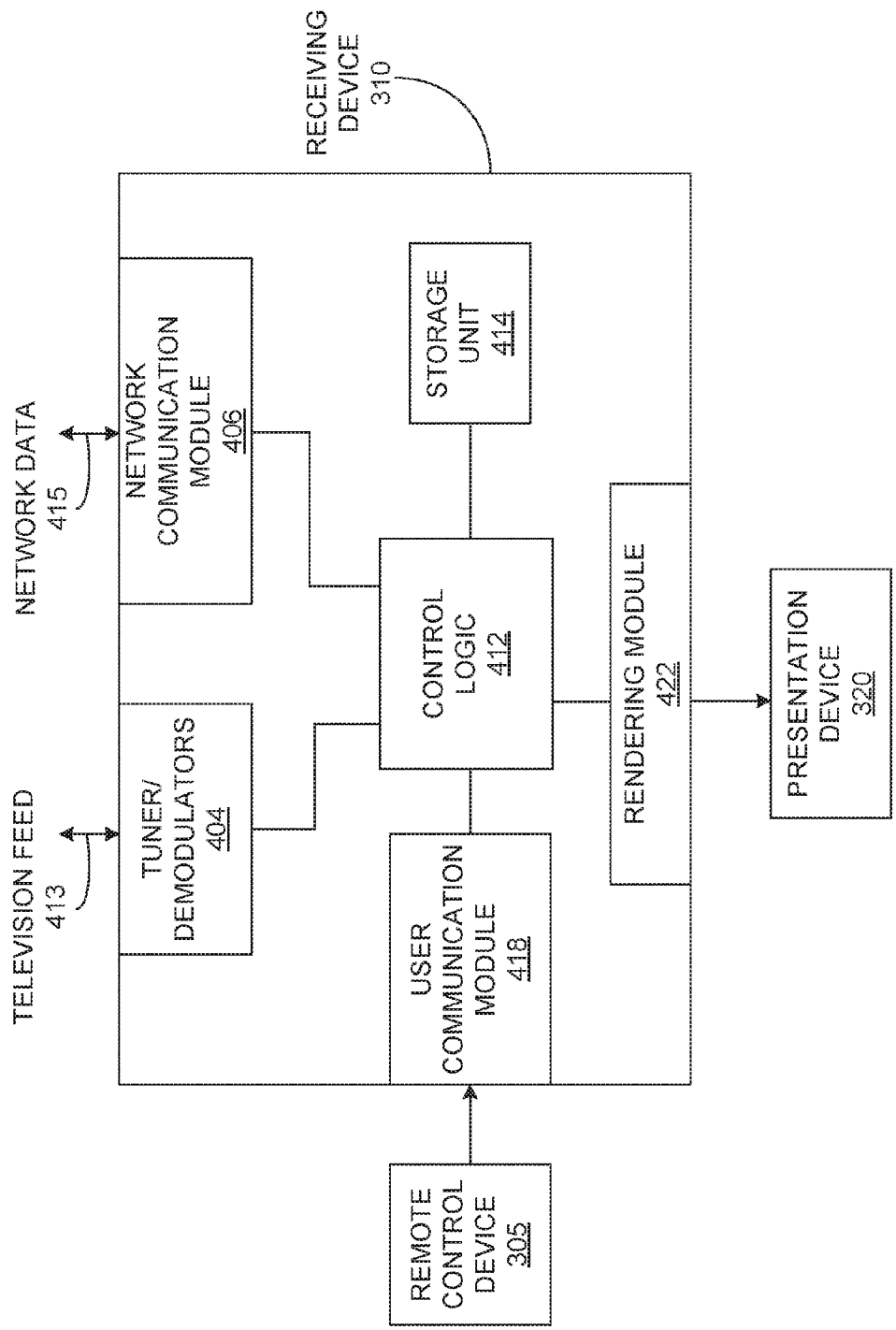
FIG. 4 illustrates an example of a receiving device 310, according to one non-limiting illustrated embodiment.

FIG. 4 illustrates an example of a receiving device 310, according to one non-limiting illustrated embodiment. The receiving device 310 may be an example of one or more of the receiving devices 310 described in reference to FIG. 3.

The receiving device 310 includes one or more tuner/demodulators 404. The tuner/demodulators may tune and process one or more channels and/or transponder signals from a television feed 413. The tuner/demodulators 404 may tune to a particular channel or transponder as part of the process of a user selecting a certain content stream for viewing on a presentation device 320. A control logic 412 may instruct the tuner/demodulators 404 to tune and demodulate a channel or transponder in response to a command for a remote control device 305. Once a channel or transponder signal has been tuned and demodulated, the control logic 412 may extract a content stream for display on the presentation device 320.

A user communication module 418 receives the user input and degradation level information from the remote control device 305. One or more storage units 414 may be included internal and/or external to the receiving device 310. The storage unit 414 may store recorded content streams and/or other control or informational data, such as the degradation level information. The control logic 412 may coordinate the storage and retrieval of content streams or other data to/from the storage unit 414.

In some embodiments, the control logic 412 may instruct a network communication module 406 to transmit the degradation level information. The network communication module 406 may be in communication with a network or other remote device, which records the transmitted degradation level information.

The receiving device 310 may also include a rendering module 422. The rendering module 422 renders a content stream into a presentable format for the presentation device 320. The control logic 412 may coordinate the output of a video stream to the rendering module 422. Furthermore, the receiving device 320 may include other components, modules, elements, or devices not illustrated for the sake of brevity.

Figure 5:
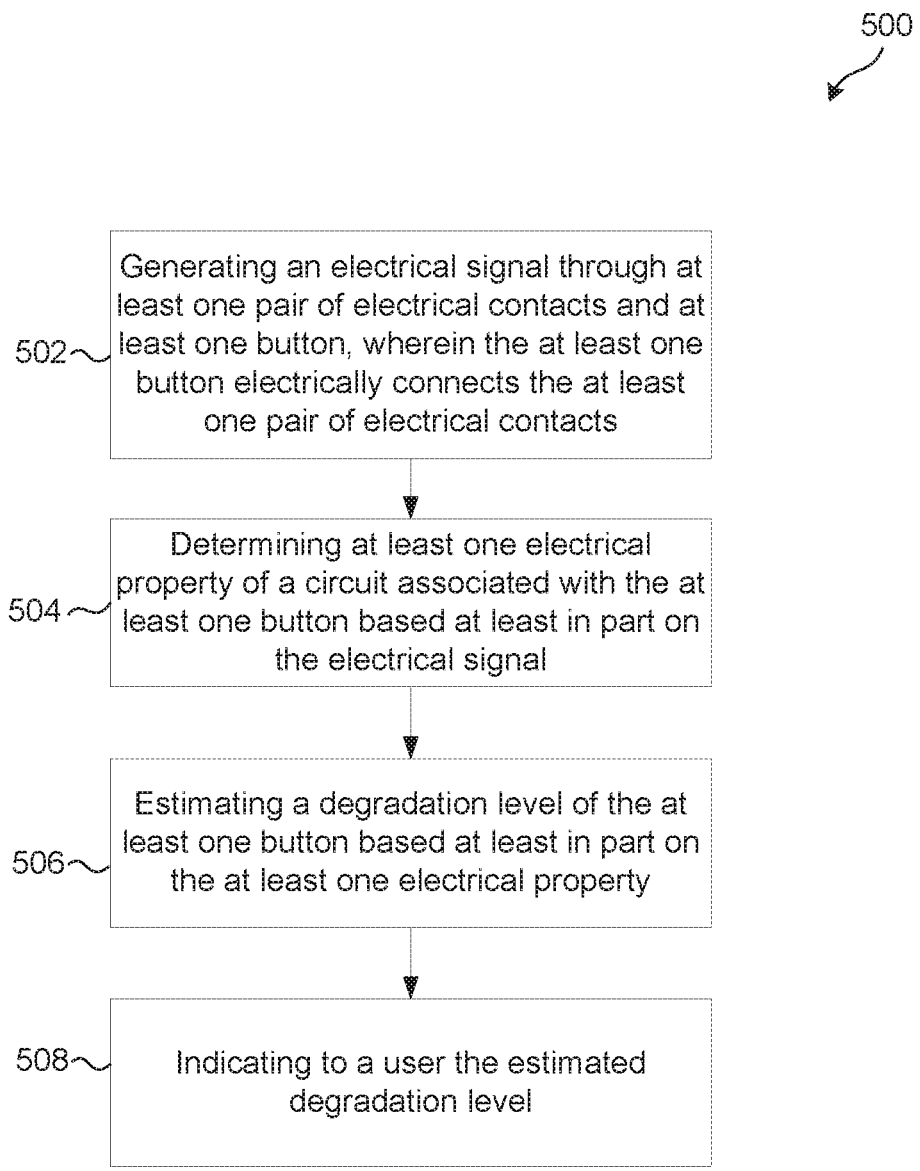
FIG. 5 is a flow diagram showing a method 500 for indicating to a user that a button is degraded, according to one non-limiting illustrated embodiment.

FIG. 5 is a flow diagram showing a method 500 for indicating to a user that a button is degraded, according to one non-limiting illustrated embodiment. The method 500 may be performed by user input device or remote control device, such as described in reference to FIGS. 1-4.

At step 502, the method 500 includes generating an electrical signal through at least one pair of electrical contacts and at least one button. The at least one button electrically connects the at least one pair of electrical contacts.

At step 504, the method 500 includes determining at least one electrical property of a circuit associated with the at least one button based at least in part on the electrical signal. The electrical property may be a voltage level, a current level, and/or an impedance associated with the at least one button.

At step 506, the method 500 includes estimating a degradation level of the at least one button based at least in part on the at least one electrical property. The degradation level may be estimated by comparing the electrical property to historical measurements of electrical properties associated with the button.

At step 508, the method 500 includes indicating to a user the estimated degradation level. The indication may include a light, a sound, a displayed message, tactile feedback, or other types of indication.

The method 500 may include additional acts, omit some acts, and/or may perform the acts in a different order than set out in the FIG. 5.

Figure 6:
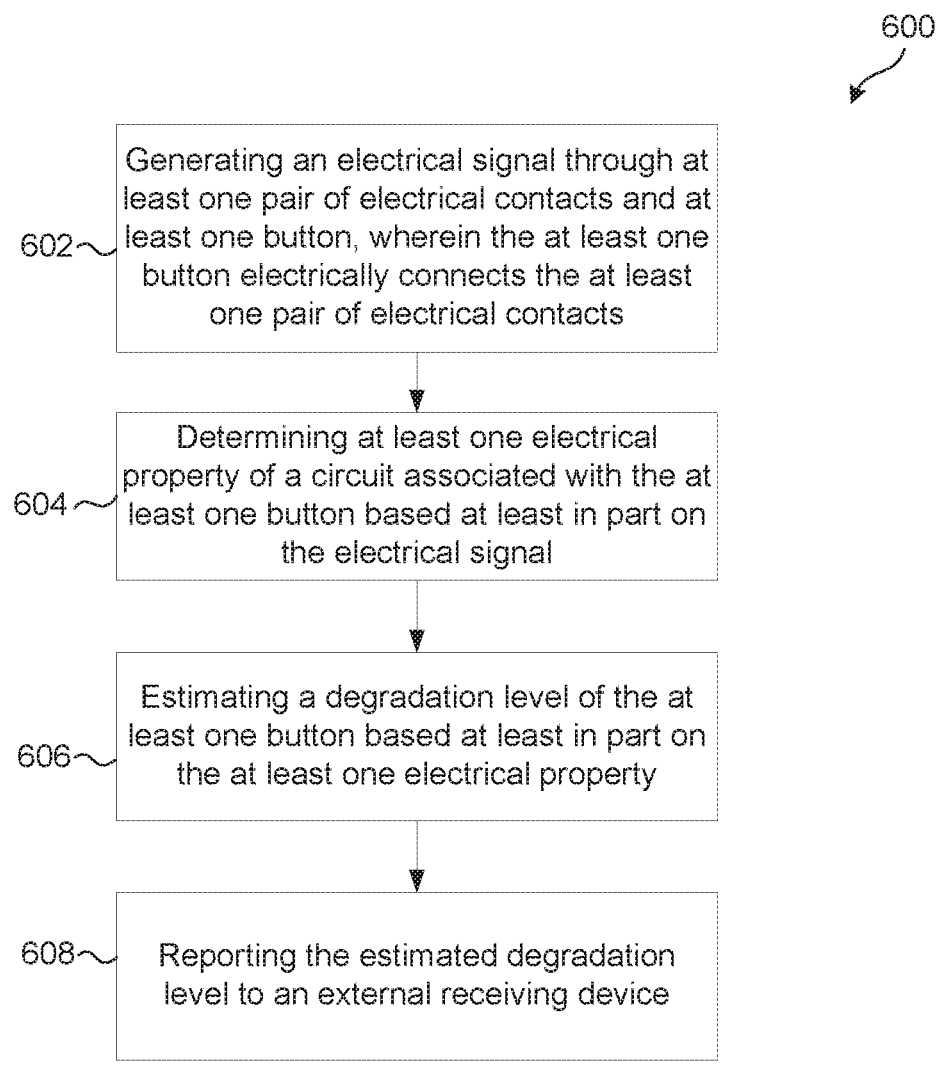
FIG. 6 is a flow diagram showing a method 600 for reporting to an external device that a button is degraded, according to one non-limiting illustrated embodiment.

FIG. 6 is a flow diagram showing a method 600 for reporting to an external device that a button is degraded, according to one non-limiting illustrated embodiment. The method 600 may be performed by user input device or remote control device, such as described in reference to FIGS. 1-4.

At step 602, the method 600 includes generating an electrical signal through at least one pair of electrical contacts and at least one button. The at least one button electrically connects the at least one pair of electrical contacts.

At step 604, the method 600 includes determining at least one electrical property of a circuit associated with the at least one button based at least in part on the electrical signal. The electrical property may be a voltage level, a current level, and/or an impedance associated with the at least one button.

At step 606, the method 600 includes estimating a degradation level of the at least one button based at least in part on the at least one electrical property. The degradation level may be estimated by comparing the electrical property to historical measurements of electrical properties associated with the button.

At step 608, the method 600 includes reporting the estimated degradation level to an external receiving device. The external receiving device may compare the estimated degradation level to historical information associated with the button. If the estimated degradation level exceeds a threshold, the external receiving device may inform the user or a manufacturer of the degraded button.

The method 600 may include additional acts, omit some acts, and/or may perform the acts in a different order than set out in the FIG. 6.

The foregoing detailed description has set forth various embodiments of the devices and/or processes via the use of block diagrams, schematics, and examples. Insofar as such block diagrams, schematics, and examples contain one or more functions and/or operations, it will be understood by those skilled in the art that many functions and/or operations within such block diagrams (e.g., the functions of the stream packer or stream packing apparatus), flowcharts, or examples can be implemented, individually and/or collectively, by a wide range of hardware, software, firmware, or virtually any combination thereof and that designing the circuitry and/or writing the code for the software and/or firmware would be well within the skill of one of ordinary skill in the art in light of the teachings of this disclosure. For example, the functions of the stream packer could be implemented in discrete logic with no central processing unit (CPU) or software involvement.

When logic is implemented as software and stored in memory, logic or information can be stored on any non-transitory computer-readable medium for use by or in connection with any processor-related system or method. In the context of this disclosure, a memory is a non-transitory computer- or processor-readable storage medium that is an electronic, magnetic, optical, or other physical device or means that non-transitorily contains or stores a computer and/or processor program. Logic and/or the information can be embodied in any computer-readable medium for use by or in connection with an instruction execution system, apparatus, or device, such as a computer-based system, processor-containing system, or other system that can fetch the instructions from the instruction execution system, apparatus, or device and execute the instructions associated with logic and/or information.

In the context of this specification, a "computer-readable medium" can be any physical element that can store the program associated with logic and/or information for use by or in connection with the instruction execution system (e.g., the control logic 412), apparatus, and/or device. The computer-readable medium can be, for example, but is not limited to, an electronic, magnetic, optical, electromagnetic, infrared, or semiconductor system, apparatus or device. More specific examples (a non-exhaustive list) of the computer readable medium would include the following: a portable computer diskette (magnetic, compact flash card, secure digital, or the like), a random access memory (RAM), a read-only memory (ROM), an erasable programmable read-only memory (EPROM, EEPROM, or Flash memory), a portable compact disc read-only memory (CDROM), and digital tape.

The various embodiments described above can be combined to provide further embodiments. Aspects of the embodiments can be modified, if necessary, to employ systems, circuits and concepts of the various patents, applications and publications to provide yet further embodiments.

The above description of illustrated embodiments, including what is described in the Abstract, is not intended to be exhaustive or to limit the embodiments to the precise forms disclosed. Although specific embodiments and examples are described herein for illustrative purposes, various equivalent modifications can be made without departing from the spirit and scope of the disclosure, as will be recognized by those skilled in the relevant art.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A user input device, comprising:
    at least one pair of electrical contacts;
    at least one button configured to electrically connect the at least one pair of electrical contacts, wherein the at least one button is one of a plurality of buttons arranged in multiple rows and multiple columns;
    a key detection module to identify one of the plurality of buttons as the at least one button that is depressed based on a column and a row between which an electrical connection is formed when the one of the plurality of buttons is depressed; and
    a degradation measurement module in electrical communication with at least one of the electrical contacts and configured to determine a degradation level of the at least one button or the at least one pair of electrical contacts based on at least one electrical property of a circuit associated with the at least one button when the at least one button electrically connects the at least one pair of electrical contacts, wherein the degradation measurement module is configured to determine the degradation level by:
        storing a value of the at least one electrical property, and
        comparing the value with historical values of the at least one electrical property to determine the degradation level.

2. The device of claim 1, wherein the degradation measurement module determines a voltage level of a signal flowing through the circuit associated with the at least one button.

3. The device of claim 1, wherein the degradation measurement module determines a current level of a signal flowing through the circuit associated with the at least one button.

4. The device of claim 1, wherein the degradation measurement module determines an impedance associated with the at least one button.

5. The device of claim 1, wherein the degradation measurement module comprises an analog to digital converter.

6. The device of claim 1, wherein the degradation measurement module compares the at least one electrical property to a threshold to determine the degradation level of the at least one button.

7. The device of claim 1, further comprising:
    an indicator configured to receive information associated with the degradation level and indicate to a user the degradation level information.

8. The device of claim 1, further configured to transmit information associated with the degradation level to an external receiving device.

9. A method for determining button degradation, comprising:
    generating an electrical signal through at least one pair of electrical contacts and at least one button, wherein the at least one button electrically connects the at least one pair of electrical contacts, wherein the at least one button is one of a plurality of buttons arranged in multiple rows and columns, wherein the generating includes:
        identifying one of the plurality of buttons as the at least one button that is depressed based on a column and a row between which an electrical connection is formed when the one of the plurality of buttons is depressed;
    determining at least one electrical property of a circuit associated with the at least one button based at least in part on the electrical signal; and
    estimating a degradation level of the at least one button or the at least one pair of electrical contacts based at least in part on the at least one electrical property by:
        storing a value of the at least one electrical property, and
        comparing the value with historical values of the at least one electrical property to estimate the degradation level.

10. The method of claim 9, wherein determining the at least one electrical property of the circuit comprises determining a voltage level of a signal flowing through the circuit associated with the at least one button.

11. The method of claim 9, wherein determining the at least one electrical property of the circuit comprises determining a current level of a signal flowing through the circuit associated with the at least one button.

12. The method of claim 9, wherein determining the at least one electrical property of the circuit comprises determining an impedance associated with the at least one button.

13. The method of claim 9, wherein estimating the degradation level comprises comparing the at least one electrical property to a threshold.

14. The method of claim 9, further comprising:
indicating the estimated degradation level to a user.

15. The method of claim 9, further comprising:
reporting the estimated degradation level to an external receiving device.

16. A communication system, comprising:
a receiving device; and
a user input device for sending user commands to the receiving device, wherein the user input device comprises:
at least one pair of electrical contacts;
at least one button configured to electrically connect the at least one pair of electrical contacts, wherein the at least one button is one of a plurality of buttons arranged in multiple rows and columns;
a key detection module to identify one of the plurality of buttons as the at least one button that is depressed based on a column and a row between which an electrical connection is formed when the one of the plurality of buttons is depressed;
a degradation measurement module in electrical communication with at least one of the electrical contacts and configured to determine a degradation level of the at least one button or the at least one pair of electrical contacts based on at least one electrical property of a circuit associated with the at least one button when the at least button electrically connects the at least one pair of electrical contacts, wherein the degradation measurement module is configured to determine the degradation level by:
storing a value of the at least one electrical property, and
comparing the value with historical values of the at least one electrical property to determine the degradation level, wherein the user input device is configured to transmit the degradation level to the receiving device.

17. The system of claim 16, wherein the degradation measurement module determines a voltage level of a signal flowing through the circuit associated with the at least one button.

18. The system of claim 16, wherein the degradation measurement module determines a current level of a signal flowing through the circuit associated with the at least one button.

19. The system of claim 16, wherein the degradation measurement module determines an impedance associated with the at least one button.

20. The system of claim 16, wherein the degradation measurement module comprises an analog to digital converter.

* * * * *